United States Patent
Qian et al.

(10) Patent No.: US 11,205,767 B2
(45) Date of Patent: Dec. 21, 2021

(54) SILICON-BASED DISPLAY PANEL, FORMING METHOD THEREOF, AND PHOTOMASK ASSEMBLY FOR EXPOSURE PROCESS OF SILICON-BASED DISPLAY PANEL

(71) Applicant: SEEYA OPTRONICS CO., LTD., Shanghai (CN)

(72) Inventors: Dong Qian, Shanghai (CN); Tieer Gu, Shanghai (CN); Qi Li, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 95 days.

(21) Appl. No.: 16/730,158

(22) Filed: Dec. 30, 2019

(65) Prior Publication Data

US 2020/0136096 A1 Apr. 30, 2020

Related U.S. Application Data

(63) Continuation of application No. PCT/CN2018/087939, filed on May 23, 2018.

(30) Foreign Application Priority Data

Dec. 29, 2017 (CN) .......................... 201711497635.7

(51) Int. Cl.
*H01L 51/00* (2006.01)
*H01L 51/56* (2006.01)

(52) U.S. Cl.
CPC .......... *H01L 51/56* (2013.01); *H01L 51/0011* (2013.01); *H01L 51/0017* (2013.01); *H01L 51/0021* (2013.01)

(58) Field of Classification Search
CPC . H01L 51/56; H01L 51/0011; H01L 51/0017; H01L 51/0021; H01L 21/0274;
(Continued)

(56) References Cited

U.S. PATENT DOCUMENTS

| 5,705,299 A | 1/1998 | Tew et al. |
| 6,287,899 B1 * | 9/2001 | Park .................... H01L 21/0274 257/E21.027 |

(Continued)

FOREIGN PATENT DOCUMENTS

| CN | 101520599 A | 9/2009 |
| CN | 102569340 A | 7/2012 |

(Continued)

OTHER PUBLICATIONS

CN Application No. 2017114976357, Third Office Action dated Jul. 22, 2021.

*Primary Examiner* — Didarul A Mazumder
(74) *Attorney, Agent, or Firm* — W&G Law Group

(57) ABSTRACT

A forming method for a silicon-based display panel includes providing a silicon substrate having a display region and a peripheral region surrounding the display region, providing a first set of photomasks corresponding to the display region, using the first set of photo masks in an exposure process of the display region, providing a second set of photomasks corresponding to the peripheral region, and using the second set of photomasks in an exposure process of the peripheral region. The exposure process of the display region and the exposure process of the peripheral region are different process steps. According to the forming method for the silicon-based display panel, splicing of pixel patterns in the display region is not carried out, so that the yield and the display effect are improved.

13 Claims, 8 Drawing Sheets

(58) Field of Classification Search
CPC ............... H01L 27/124; H01L 27/1288; H01L 21/32139; G03F 1/50
USPC ........................................ 257/40; 438/82, 99
See application file for complete search history.

(56) References Cited

U.S. PATENT DOCUMENTS

| | | | |
|---|---|---|---|
| 2005/0213000 A1* | 9/2005 | Akimoto | G02F 1/1339 349/113 |
| 2015/0144977 A1* | 5/2015 | Odaka | H01L 33/44 257/98 |
| 2016/0190456 A1 | 6/2016 | You | |

FOREIGN PATENT DOCUMENTS

| CN | 102738208 A | 10/2012 |
|---|---|---|
| CN | 105068373 A | 11/2015 |
| CN | 105185816 A | 12/2015 |
| CN | 105842980 A | 8/2016 |
| CN | 106098699 A | 11/2016 |

\* cited by examiner

SILICON-BASED DISPLAY PANEL, FORMING METHOD THEREOF, AND PHOTOMASK ASSEMBLY FOR EXPOSURE PROCESS OF SILICON-BASED DISPLAY PANEL

TECHNICAL FIELD

The present invention relates to silicon-based display technologies, in particular, relates to a silicon-based display panel having good display effect and a forming method thereof, and also relates to a photomask assembly for exposure process of a silicon-based display panel.

BACKGROUND

The existing silicon-based display panels, such as Organic Light-Emitting Diode (OLED) on Silicon display panels, have a monocrystalline silicon chip as a substrate, and have a pixel size that is 1/10 of a size of the conventional display devices and much higher fineness than the conventional devices. The monocrystalline silicon chip adopts the existing well-developed integrated circuit CMOS technology, which not only realizes an active addressing matrix of the display pixels, but also achieves a driving control circuit of various functions such as SRAM memory and T-CON on the silicon chip. External wirings of the device are greatly reduced, thereby increasing reliability and realizing light-weight and micro-display.

However, a size of the display area is also limited. The existing OLED on Silicon display panel products are generally made from silicon chips of 8 or 12 inches, an exposure area of an exposure machine used in the manufacturing process is smaller than the size of the silicon chip used, while the size of the display panel is exactly determined by this exposure area of the exposure machine. Due to the limitation of the exposure area of the exposure machine, the size of the silicon-based OLED display panel product cannot be made larger. One of the technical means known in the related art is to obtain a larger size by using a splicing exposure method. As shown in FIG. 1, the entire display panel is subjected to exposures of photomasks 1, 2, 3, 4, respectively, and according to an arrangement of the entire display panel, the photomasks 1, 2, 3, 4 perform a splicing exposure on display regions and a splicing exposure on peripheral circuits. For example, FIG. 1 shows four photomasks 1, 2, 3, 4, where the photomask 1 includes a plurality of peripheral circuit patterns 1a and a pattern 1b of a display region 1, and the patterns on the photomask 1 correspond to structures to be formed in an upper left corner portion of a display panel; similarly, the photomask 2 includes a plurality of peripheral circuit patterns 2a and a pattern 2b of a display region 2, and the patterns on the photomask 2 correspond to structures to be formed in an upper right corner portion of the display panel; the photomask 3 includes a plurality of peripheral circuit patterns 3a and a pattern 3b of a display region 3, and the patterns on photomask 3 correspond to structures to be formed in a lower left corner of the display panel; and the photomask 4 includes a plurality of peripheral circuit patterns 4a and a pattern 4b of a display region 4, and the patterns on photomask 4 correspond to structures to be formed in lower right corner of the display panel. When the exposures of the display panel are finished respectively using the photomasks 1, 2, 3, 4, the display region 1, the display region 2, the display region 3, and the display region 4 are spliced together to form an entire display region, and the peripheral circuits are also spliced and connected. However, it is difficult for the splicing exposure to ensure an alignment accuracy at the splicing positions, especially under the trend of higher and higher resolution and narrower and narrower wiring width. In particular, the display region is more sensitive, for example, non-simultaneous exposures to the same metal layer in the display region using different masks may result in problems such as uneven brightness, uneven display of gray-scale transitions, and the like, causing that the process is difficult, the display effect is poor, and the yield is low.

SUMMARY

The present disclosure provides a forming method for a silicon-based display panel, comprising: providing a silicon substrate including a display region and a peripheral region surrounding the display region, providing a first set of photomasks corresponding to the display region, using the first set of photomasks in an exposure process for the display region, providing a second set of photomasks corresponding to the peripheral region, and using the second set of photomasks in an exposure process for the peripheral region. The exposure process of the display region and the exposure process of the peripheral region are different process steps.

Optionally, an area of the display region is smaller than or equal to an effective exposure area of an exposure machine.

Optionally, the peripheral region includes a plurality of peripheral circuits, and the second set of photomasks is provided with a plurality of peripheral circuit patterns corresponding to the plurality of peripheral circuits, wherein the plurality of peripheral circuit patterns is compact and spaced apart from one another.

Optionally, a first wiring is formed in the display region by using the first set of photomasks, and a second wiring is formed in the peripheral region by using the second set of photomasks, wherein a width of the first wiring is smaller than or equal to a width of the second wiring.

Optionally, the first wiring and the second wiring are electrically connected to each other in such a manner that pixel units in the display region are in communication with circuits in the peripheral region.

Optionally, the first set of photomasks comprises a plurality of photomasks corresponding to an N-well exposure process, a P-well exposure process, a shallow trench isolation exposure process, a P-well $V_T$ adjust exposure process, an N-well $V_T$ adjust exposure process, a gate exposure process, an N-LDD exposure process, an N-channel source/drain exposure process, a P-channel source/drain exposure process, a salicide block exposure process, a high resistance polysilicon resistor exposure process, a contact hole exposure process, a first metal layer exposure process, a via hole exposure process, and a second metal layer exposure process of the display region, respectively; and the second set of photomasks comprises a plurality of photomasks corresponding to an N-well exposure process, a P-well exposure process, a shallow trench isolation exposure process, a P-well $V_T$ adjust exposure process, an N-well $V_T$ adjust exposure process, a gate exposure process, an N-LDD exposure process, an N-channel source/drain exposure process, a P-channel source/drain exposure process, a salicide block exposure process, a high resistance polysilicon resistor exposure process, a contact hole exposure process, a first metal layer exposure process, a via hole exposure process, and a second metal layer exposure process of the peripheral region, respectively.

Optionally, corresponding exposure processes of the display region and the peripheral region are successively completed in adjacent sequential process steps; or corresponding exposure processes of the peripheral region and the display region are successively completed in adjacent sequential process steps.

Optionally, the forming method further comprises a cleaning process, a photoresist coating process, and a photoresist curing process, prior to the exposure process steps, and a development process and a photoresist stripping process posterior to the exposure process steps, wherein the cleaning process, the photoresist coating process, the photoresist curing process, the development process, and the photoresist stripping process of the display region and the peripheral region are performed respectively in a same process step.

Optionally, the forming method further comprises an insulating layer forming process, an insulating layer etching process, an ion implantation process, a metal layer forming process, and a metal layer etching process, wherein the insulating layer forming process, the insulating layer etching process, the ion implantation process, the metal layer forming process, and the metal layer etching process of the display region and the peripheral region are performed respectively in a same processing step.

In the forming method of the silicon-based display panel provided by the present disclosure, the exposure pattern for the display region is set in the first set of photomasks, the exposure pattern for the peripheral region is set in the second set of photomasks, and the area of the display region is set to be smaller than or equal to the effective exposure area of the exposure machine, i.e., maximizing the forming of the display region pattern in the effective exposure area with one exposure without splicing of the pixel patterns in the display region, which improves the yield and the display effect. As for the peripheral circuits, they are scattered around the display region and are not connected to each other, and therefore set on the second set of photomasks and subjected to exposure in a process step different from that of the display region patterns, which will not affect the yield and display effect.

The present disclosure further provides a silicon-based display panel, comprising a display region and a peripheral region surrounding the display region, wherein an area of the display region is smaller than or equal to an effective exposure area of an exposure machine. An exposure process of the display region and an exposure process of the peripheral region are performed in different process steps.

Optionally, the silicon-based display panel provided by the present disclosure further comprises an OLED display layer, wherein the OLED display layer is disposed in the display region.

As for the silicon-based display panel provided by the present disclosure, the exposure processes of the display region and the peripheral region are performed in different process steps, and no pattern splicing is performed in the display region, thereby having a good display effect and a high yield.

The present disclosure further provides a photomask assembly for an exposure process of a silicon-based display panel. The photomask assembly comprises a first set of photomasks and a second set of photomasks. The first set of photomasks corresponds to a display region of the silicon-based display panel and the second set of photomasks corresponds to a peripheral region of the silicon-based display panel.

Optionally, an area of a pattern of the display region corresponding to the first set of photomasks is smaller than or equal to an effective exposure area of an exposure machine, the second set of photomasks is provided with a plurality of circuit patterns, the plurality of circuit patterns is compact and spaced apart from one another, and a total area occupied by the plurality of circuit patterns is smaller than or equal to the effective exposure area of the exposure machine.

Optionally, the first set of photomasks comprises a plurality of photomasks being a photomask for an N-well exposure process, a photomask for a P-well exposure process, a photomask for a shallow trench isolation exposure process, a photomask for a P-well $V_T$ adjust exposure process, a photomask for an N-well $V_T$ adjust exposure process, a photomask for a gate exposure process, a photomask for an N-LDD exposure process, a photomask for an N-channel source/drain exposure process, a photomask for a P-channel source/drain exposure process, a photomask for a salicide block exposure process, a photomask for a high resistance polysilicon resistor exposure process, a photomask for a contact hole exposure process, a photomask for a first metal layer exposure process, a photomask for a via hole exposure process, and a photomask for a second metal layer exposure process of the display region, respectively.

Optionally, the second set of photomasks comprises a plurality of photomasks being a photomask for an N-well exposure process, a photomask for a P-well exposure process, a photomask for a shallow trench isolation exposure process, a photomask for a P-well $V_T$ adjust exposure process, a photomask for an N-well $V_T$ adjust exposure process, a photomask for a gate exposure process, a photomask for an N-LDD exposure process, a photomask for an N-channel source/drain exposure process, a photomask for a P-channel source/drain exposure process, a photomask for a salicide block exposure process, a photomask for a high resistance polysilicon resistor exposure process, a photomask for a contact hole exposure process, a photomask for a first metal layer exposure process, a photomask for a via hole exposure process, and a photomask for a second metal layer exposure process of the peripheral region, respectively.

The photomask assembly provided by the present disclosure is used in the forming method of the silicon-based display panel, the exposure pattern for the display region is set in the first set of photomasks, the exposure pattern for the peripheral region is set in the second set of photomasks, and the area of the display region is set to be smaller than or equal to the effective exposure area of the exposure machine, i.e., maximizing the forming of the display region pattern in the effective exposure area with one exposure without splicing of the pixel patterns in the display region, which improves the yield and the display effect. As for the peripheral circuits, they are scattered around the display region and are not connected to each other, and therefore set on the second set of photomasks and subjected to exposure in a process step different from that of the display region patterns, which will not affect the yield and display effect.

DESCRIPTION OF EMBODIMENTS

The following are some possible example embodiments, intended to provide a basic understanding of the present disclosure but not intended to identify pivotal or decisive elements of the present disclosure or to define a claimed scope. It will be readily understood that those skilled in the art can propose other interchangeable implementations according to the technical solutions of the present disclosure without changing the substantive spirit of the present disclosure. Therefore, the following specific embodiments and the accompanying drawings are merely illustrative of the technical solutions of the present disclosure, and should not be construed as all of the present disclosure or limitation or confinement to the technical solutions of the present disclosure.

Figure 1:
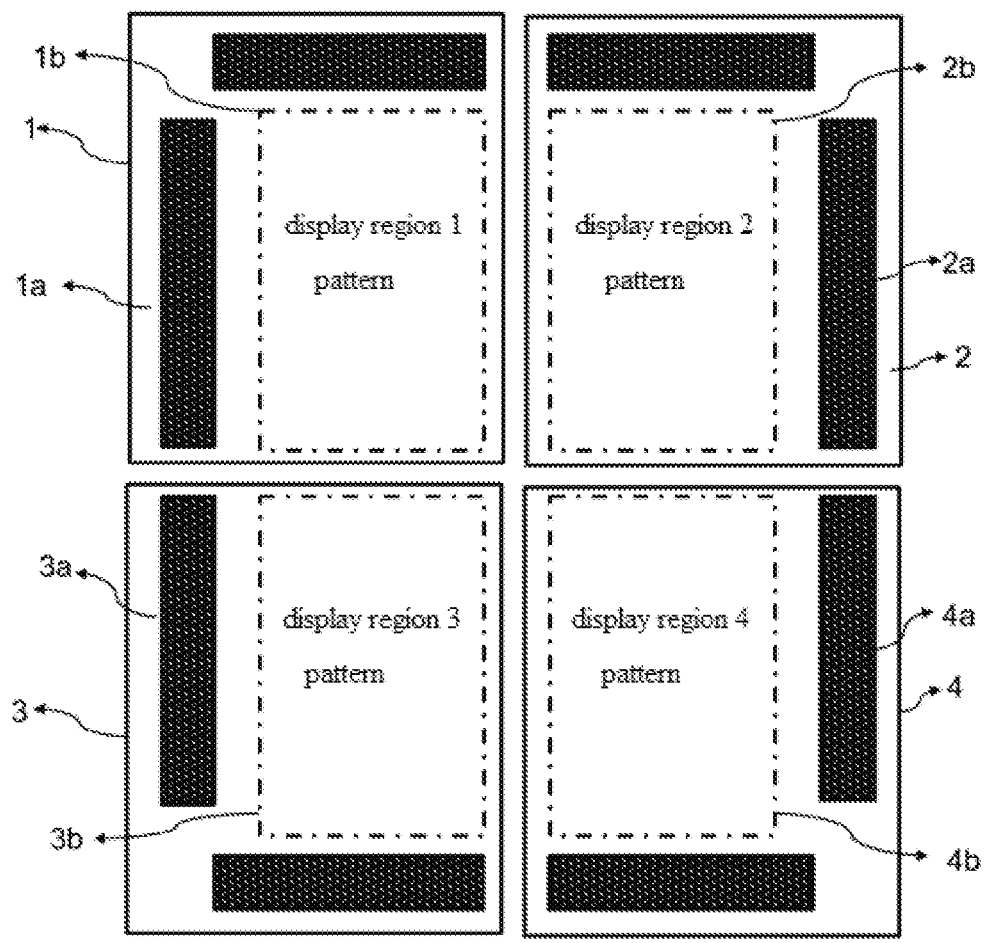
FIG. 1 is a schematic diagram of a conventional splicing exposure technique in related art.
Figure 2:
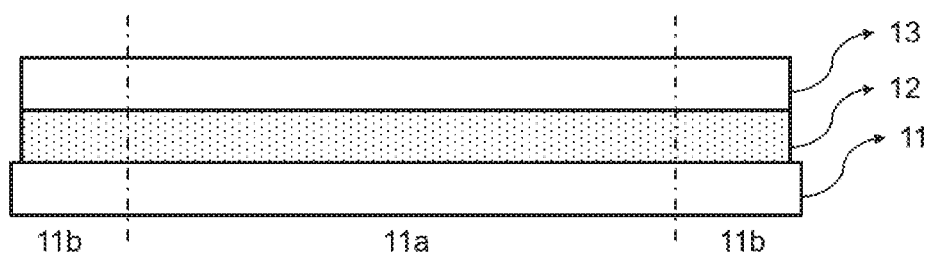
FIG. 2 is a schematic diagram of a forming method for a silicon-based display panel according to an embodiment of the present disclosure.

The present disclosure provides a forming method for a silicon-based display panel. First, referring to FIG. 2, a silicon substrate 11 is provided, the silicon substrate 11 is a monocrystalline silicon chip, and the silicon substrate 11 includes a display region 11a and a peripheral region 11b surrounding the display region 11a. The display region 11a is a region for forming pixel units, and the peripheral region 11b is a region for forming a peripheral circuit.

A layer to be processed 12 is formed on the silicon substrate 11. The layer to be processed 12 can be a layer to be etched or a layer to be doped. In this embodiment, the layer to be processed 12 is a layer to be etched, and the layer to be processed 12 covers the display region 11a and the peripheral region 11b of the silicon substrate 11. Thereafter, a photoresist coating process is performed to form a photoresist layer 13 on the layer to be processed 12, the photoresist 13 covers the display region 11a and the peripheral region 11b of the silicon substrate 11, and then a photoresist curing process is performed by baking the photoresist layer 13 to be cured.

Figure 3:
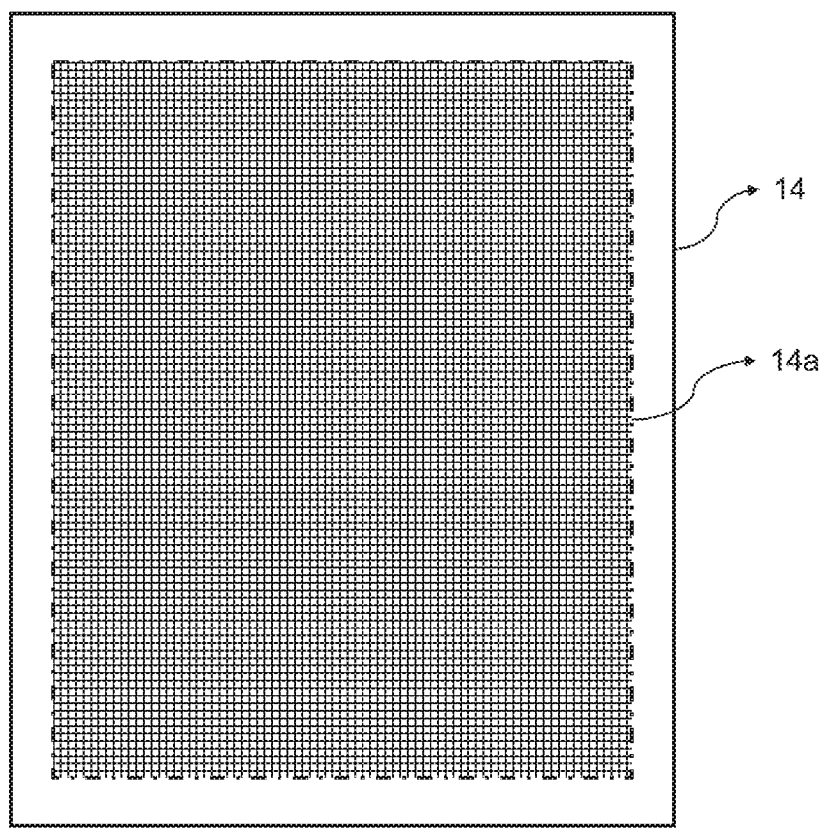
FIG. 3 is a schematic diagram of a first set of photomasks.
Figure 4:
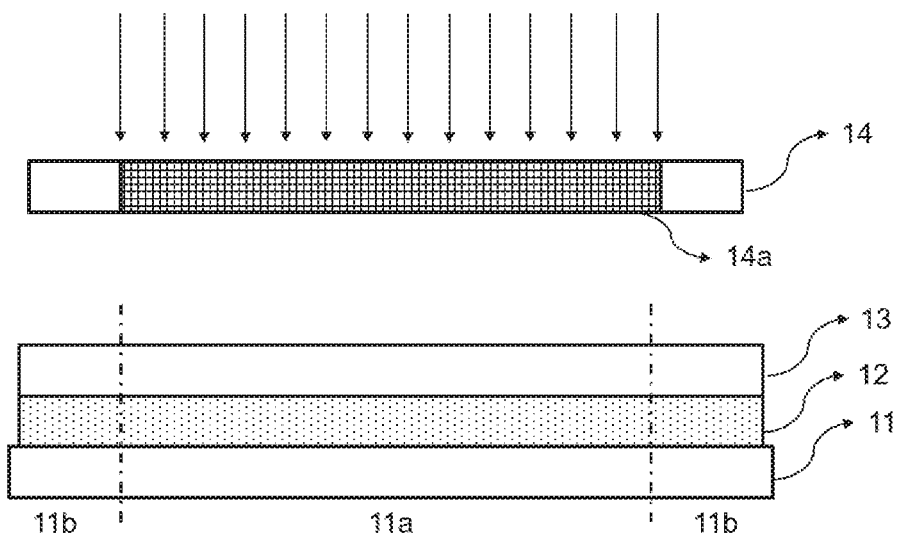
FIG. 4 is a schematic diagram of the exposure process using the first set of photomasks.

A first set of photomasks 14 is provided, as shown in FIG. 3. The first set of photomasks 14 corresponds to the entire display region 11a of the silicon substrate 11, and is provided with a display region pattern 14a for display region exposure. Referring to FIG. 4, the photoresist layer 13 of the display region 11a is exposed using the first set of photomasks 14. The area of the display region 11a is smaller than or equal to an effective exposure area of an exposure machine. Therefore, a pattern of the display region 11a can be finished in one exposure, and the pixels of the display region 11a are not spliced, thereby improving the yield and display effect.

Figure 5:
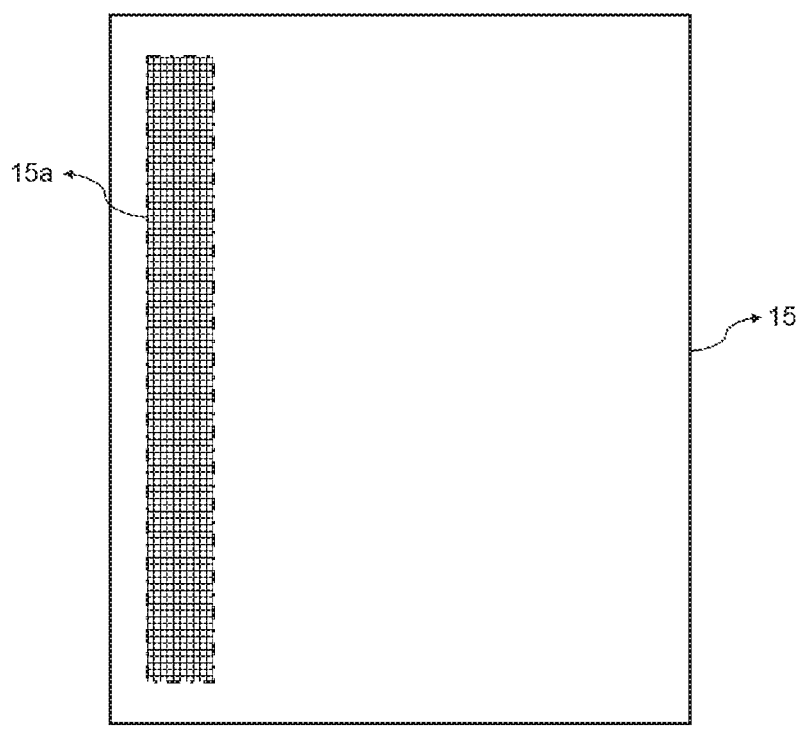
FIG. 5 is a schematic diagram of a second set of photomasks.
Figure 6:
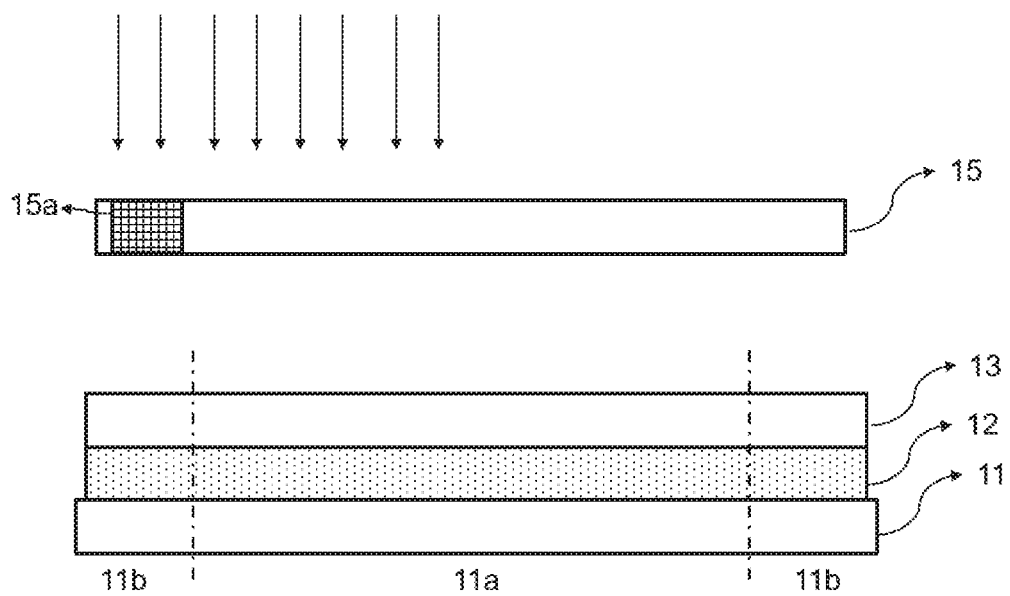
FIG. 6 is a schematic diagram of the exposure process using the second set of photomasks.
Figure 7A:
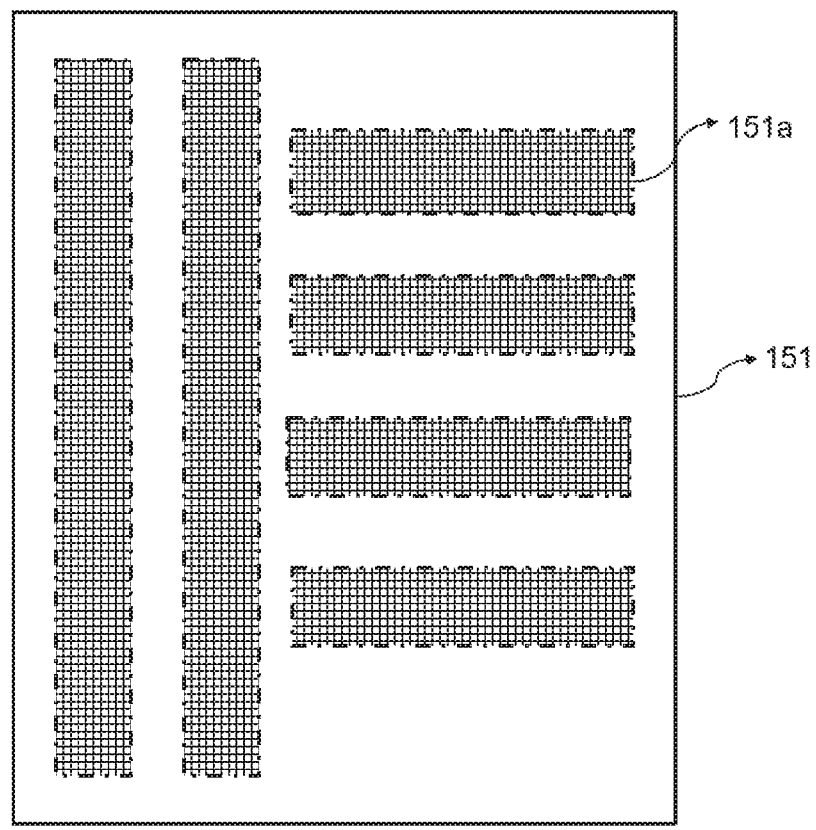
FIG. 7a is a schematic diagram of a second set of photomasks in another embodiment.
Figure 7B:
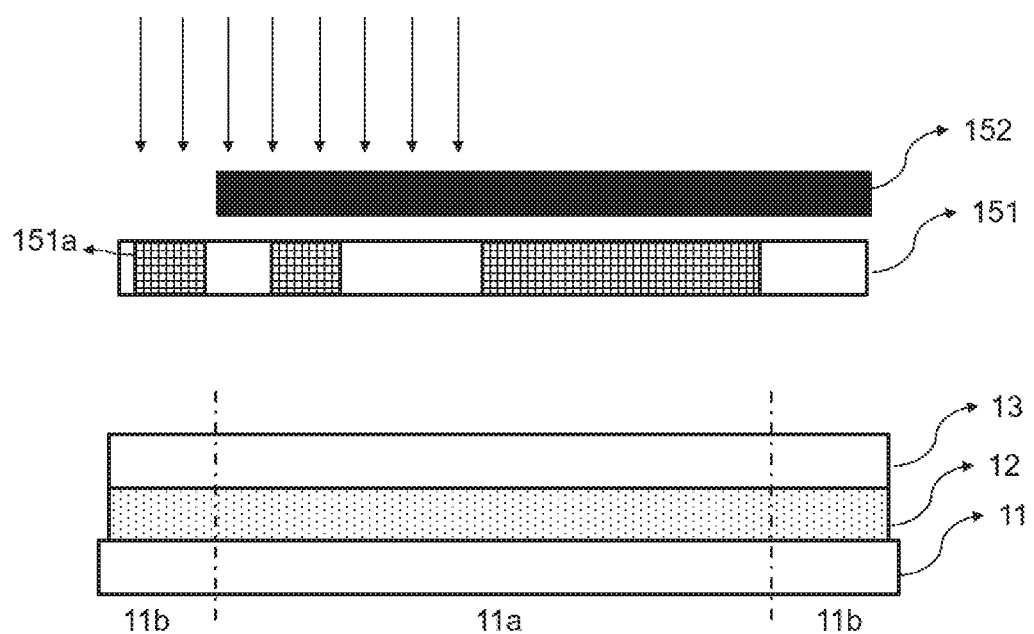
FIG. 7b is a schematic diagram of the exposure process using the second set of photomasks in another embodiment.

Then, a second set of photomasks 15 is provided, as shown in FIG. 5. The second set of photomasks 15 corresponds to the peripheral region 11b of the silicon substrate 11, and is provided with a peripheral circuit pattern 15a for peripheral region exposure. Referring to FIG. 6, the photoresist layer 13 of the peripheral region 11b is exposed using the second set of photomasks 15, and the peripheral circuit pattern is transferred and printed onto the photoresist layer 13 of the peripheral region 11b. Referring to FIG. 7a, in another embodiment, the second set of photomasks 151 is provided with a plurality of peripheral circuit patterns 151a, and the plurality of peripheral circuit patterns 151a is compact and spaced apart from one another. Referring to FIG. 7b, when an exposure is performed using the second set of photomasks 151 shown in FIG. 7a, a baffle 152 is used to cover a portion of the peripheral circuit patterns that is not required to be exposed. When a next exposure is to be performed, the second set of photomasks 151 and the baffle 152 are moved to expose the position where the pattern exposure is required, and the other peripheral circuit patterns are covered. In this way, the exposures of respective peripheral circuit patterns 151a on the second set of photomasks 151 are sequentially performed. In the embodiment shown in FIG. 6, each pattern layer of each peripheral circuit requires a separate second set of photomasks, while each peripheral circuit pattern layer shown in FIG. 7a is disposed on one second set of photomasks, and a baffle is used in combination, such that the number of photomasks used is reduced.

In the forming method for the silicon-based display panel provided by present disclosure, the exposure pattern of the display region is provided on the first set of photomasks, the exposure pattern of the peripheral circuit is provided on the second set of photomasks, and the area of the display region is set to be smaller than or equal to the effective exposure area of the exposure machine. That is, forming of the display region patterns is maximized in the effective exposure area with one exposure, without splicing display region pixel patterns, thereby improving the yield and display effect. As for the peripheral circuits, they are scattered around the display region and are not connected to each other, and therefore set on the second set of photomasks and subjected to exposure in a process step different from that of the display region patterns, which will not affect the yield and display effect.

In the above embodiments, the first set of photomasks is first used for exposure of the display region pattern, and then the second set of photomasks is used for exposure of the peripheral circuits. That is, the exposure processes corresponding to the display region and the peripheral region are successively completed in adjacent sequential processing steps. In other embodiments, it is also possible that the second set of photomasks is first used for exposure of the peripheral circuit patterns, and then the first set of photomasks is used for exposure of the display region pattern. That is, the exposure processes corresponding to the peripheral region and the display region are successively completed in adjacent sequential processing steps. The above two embodiments can achieve the same technical effect.

Figure 8:
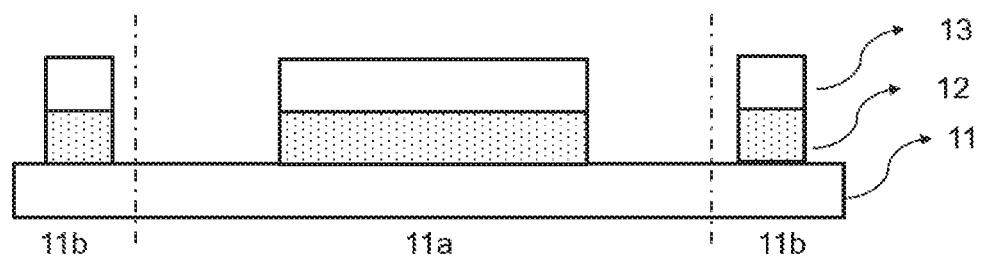
FIG. 8 is a schematic diagram of a development and etching process.
Figure 9:
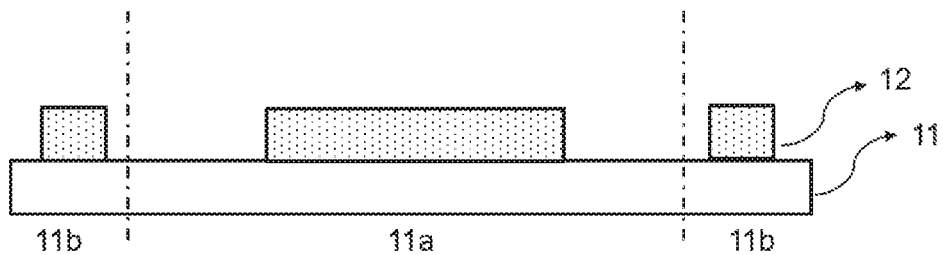
FIG. 9 is a schematic diagram of a photoresist stripping process.

Next, referring to FIG. 8, after the exposure processes are completed, the photoresist layer 13 is subjected to a development process, a portion of the photoresist layer 13 remains, and then the remaining photoresist layer 13 is used as a mask to etch the layer to be processed 12. Then, referring to FIG. 9, after the etching is completed, a photoresist stripping process is performed to remove the remaining photoresist layer 13, such that the layer to be processed 12 forms corresponding patterns in both the display region 11a and the peripheral region 11b. In the above embodiment, the layer to be processed 12 is a layer to be etched. In a case where the layer to be processed is a layer to be doped, the layer to be processed is doped with the photoresist layer that has been subjected to the exposure as the mask, and the photoresist stripping process is then performed after the doping is completed to remove the remaining photoresist layer.

Figure 10:
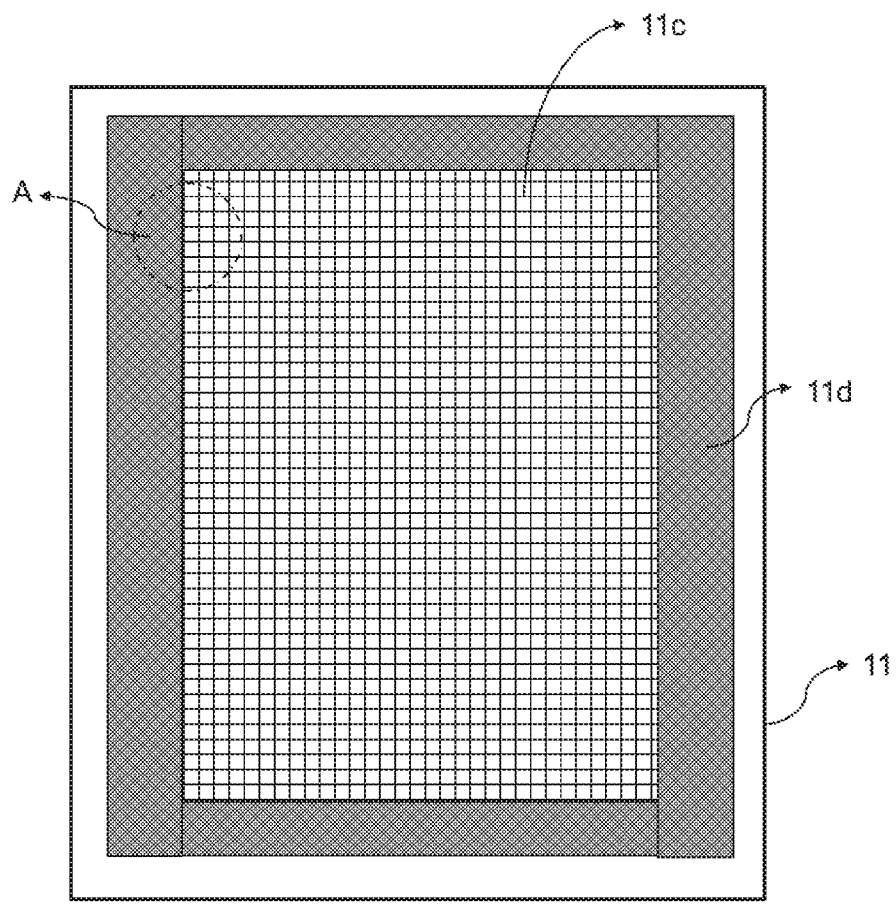
FIG. 10 is a schematic diagram of patterns on a silicon substrate after a photoresist layer has been removed.
Figure 11:
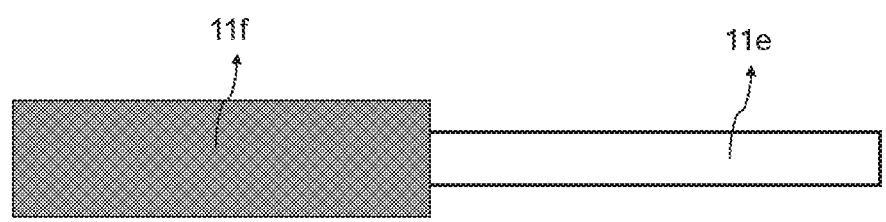
FIG. 11 is an enlarged schematic diagram of a portion A in FIG. 10.

FIG. 10 is a schematic diagram of patterns on a silicon substrate after the photoresist layer has been removed, and FIG. 11 is an enlarged schematic diagram of a portion A in FIG. 10. A pattern 11c of the pixel unit is formed in the display region, the pattern 11c includes a first wiring 11e, a peripheral circuit pattern 11d is formed in the peripheral region, and the peripheral circuit pattern 11d includes a second wiring 11f. Due to the requirement on high resolution, a size of the pixel unit is smaller and smaller, and thus a width the first wiring 11e is smaller and smaller. However, the requirement on a width of the wiring of the peripheral circuit is not as high as that of the display region, a width of the second wiring 11f can be designed to be larger within a permissible design range, such that wiring breakage is unlikely to occur in the manufacturing process, thereby increasing the yield and reducing a resistance of the second wiring. The peripheral circuit is required to be connected to the pixel unit in the display region, so as to transmit a driving signal to the pixel unit. Therefore, the first wiring 11e and the second wiring 11f are electrically connected to each other, i.e., the display region and the peripheral circuit are spliced together, and the width of the second wiring 11f is larger than the width of the first wiring 11e, which also reduces the requirement on splicing precision and improves the yield.

The silicon-based display panel is required to be subjected to multiple exposure processes, and a plurality of photomasks is required. Therefore, the first set of photomasks includes a plurality of photomasks, and the plurality of photomasks corresponds to an N-well exposure process, a P-well exposure process, a shallow trench isolation exposure process, a P-well $V_T$ adjust exposure process, an N-well $V_T$ adjust exposure process, a gate exposure process, an N-LDD exposure process, an N-channel source/drain exposure process, a P-channel source/drain exposure process, a salicide block exposure process, a high resistance polysilicon resistor exposure process, a contact hole exposure process, a first metal layer exposure process, a via hole exposure process, and a second metal layer exposure process of the display region, respectively. Similarly, the second set of photomasks includes a plurality of photomasks, and the plurality of photomasks corresponds to an N-well exposure process, a P-well exposure process, a shallow trench isolation exposure process, a P-well $V_T$ adjust exposure process, an N-well $V_T$ adjust exposure process, a gate exposure process, an N-LDD exposure process, an N-channel source/drain exposure process, a P-channel source/drain exposure process, a salicide block exposure process, a high resistance polysilicon resistor exposure process, a contact hole exposure process, a first metal layer exposure process, a via hole exposure process, and a second metal layer exposure process of the peripheral region, respectively.

In addition to the exposure processes, the forming method for the silicon substrate further includes a cleaning process, a photoresist coating process, and a photoresist curing process, prior to the exposure process steps, and a photoresist stripping process posterior to the exposure process steps. Among the above processes, each process is performed simultaneously on both the display region and the peripheral region in the same step. That is, only the exposure process of the display region and the exposure process of the peripheral region are performed in different steps, and any other process of the display region and the peripheral region is performed in the same step.

In addition, the forming method for the silicon substrate further includes an insulating layer forming process, an insulating layer etching process, an ion implantation process, a metal layer forming process, and a metal layer etching process. Any of these processes is performed simultaneously on both the display region and the peripheral region in the same processing step.

By performing the pattern exposure of the display region and the pattern exposure of the peripheral region in different process steps, the forming method for the silicon substrate provided in the embodiments of the present disclosure can overcome the problems such as low yield and poor display effect caused by splicing of the display region patterns. In the embodiments of the present disclosure, the splicing is performed between the display region and the peripheral circuit, and the requirement of the splicing precision between the two is low, thereby ensuring the yield and display effect. Other processes other than the exposure processes of the display region and the peripheral region are performed in the same process step, thereby ensuring the manufacturing efficiency.

The present disclosure further provides a silicon-based display panel, which is formed by the above forming method. Specifically, the silicon-based display panel provided by the present disclosure includes a display region, and a peripheral region surrounding the display region, the area of the display region is smaller than or equal to an effective exposure area of the exposure machine, and an exposure process of the display region and an exposure process of the peripheral region are performed in different process steps.

In addition, an embodiment of the present disclosure further provides a silicon-based display panel, including an OLED display layer, and the OLED display layer is disposed in the display region.

An embodiment of the present disclosure further provides a photomask assembly for the exposure process of the silicon-based display panel. Referring to FIG. 3, FIG. 5, and FIG. 7a in combination of the description about the forming method in the above embodiments, the photomask assembly provided by the embodiments of the present disclosure includes a first set of photomasks and a second set of photomasks. The first set of photomasks corresponds to the display region of the silicon-based display panel, and the second set of photomasks corresponds to the peripheral region of the silicon-based display panel. An area of a pattern of the display region corresponding to the first set of photomasks is smaller than or equal to the effective exposure area of the exposure machine, the second set of photomasks is provided with a plurality of circuit patterns, and the plurality of circuit patterns is compact and spaced apart from one another.

Further, corresponding to the multiple exposures of the manufacturing process of the silicone-based substrate, the first set of photomasks includes a plurality of photomasks used respectively for an N-well exposure process, a P-well exposure process, a shallow trench isolation exposure process, a P-well $V_T$ adjust exposure process, an N-well $V_T$ adjust exposure process, a gate exposure process, an N-LDD exposure process, an N-channel source/drain exposure process, a P-channel source/drain exposure process, a salicide block exposure process, a high resistance polysilicon resistor exposure process, a contact hole exposure process, a first metal layer exposure process, a via hole exposure process, and a second metal layer exposure process of the display region; similarly, the second set of photomasks includes a plurality of photomasks used respectively for an N-well exposure process, a P-well exposure process, a shallow trench isolation exposure process, a P-well $V_T$ adjust exposure process, an N-well $V_T$ adjust exposure process, a gate exposure process, an N-LDD exposure process, an N-channel source/drain exposure process, a P-channel source/drain exposure process, a salicide block exposure process, a high resistance polysilicon resistor exposure process, a contact hole exposure process, a first metal layer exposure process, a via hole exposure process, and a second metal layer exposure process of the peripheral region.

The photomask assembly provided by the present disclosure is used in the forming method for the silicon-based display panel, the exposure pattern for the display region is set in the first set of photomasks, the exposure pattern for the peripheral region is set in the second set of photomasks, and the area of the display region is set to be smaller than or equal to the effective exposure area of the exposure machine, i.e., maximizing the forming of the display region pattern in the effective exposure area with one exposure without splicing of the pixel patterns in the display region, which improves the yield and the display effect. As for the peripheral circuits, they are scattered around the display region and are not connected to each other, and therefore set on the second set of photomasks and subjected to exposure in a process step different from that of the display region patterns, which will not affect the yield and display effect.

The above description is merely a description of the preferred embodiments of the present disclosure, but not intended to limit the scope of the present disclosure. Any changes or modifications made by those skilled in the art according to the above disclosed contents shall be included in the protection scope of the claims.

What is claimed is:

1. A forming method for a silicon-based display panel, the forming method comprising:
    providing a silicon substrate comprising a display region and a peripheral region surrounding the display region;
    providing a first set of photomasks corresponding to the display region, the first set of photomasks being used in an exposure process for the display region; and
    providing a second set of photomasks corresponding to the peripheral region, the second set of photomasks being used in an exposure process for the peripheral region;
    wherein the exposure process of the display region and the exposure process of the peripheral region are different process steps; and
    wherein the exposure process for the display region and the exposure process for the peripheral region are successively completed in adjacent sequential process steps; or the exposure process for the peripheral region and the exposure process for the display region are successively completed in adjacent sequential process steps.

2. The forming method for a silicon-based display panel according to claim 1, wherein an area of the display region is smaller than or equal to an effective exposure area of an exposure machine.

3. The forming method for a silicon-based display panel according to claim 1, wherein
    the peripheral region includes a plurality of peripheral circuits;
    the second set of photomasks is provided with a plurality of peripheral circuit patterns corresponding to the plurality of peripheral circuits; and
    the plurality of peripheral circuit patterns is compact and spaced apart from one another.

4. The forming method for a silicon-based display panel according to claim 1, wherein
    a first wiring is formed in the display region by using the first set of photomasks,
    a second wiring is formed in the peripheral region by using the second set of photomasks, and
    a width of the first wiring is smaller than or equal to a width of the second wiring.

5. The forming method for a silicon-based display panel according to claim 4, wherein the first wiring and the second wiring are electrically connected to each other in such a manner that pixel units in the display region are in communication with circuits in the peripheral region.

6. The forming method for a silicon-based display panel according to claim 1, wherein the first set of photomasks comprises a plurality of photomasks corresponding to an N-well exposure process, a P-well exposure process, a shallow trench isolation exposure process, a P-well $V_T$ adjust exposure process, an N-well $V_T$ adjust exposure process, a gate exposure process, an N-LDD exposure process, an N-channel source/drain exposure process, a P-channel source/drain exposure process, a salicide block exposure process, a high resistance polysilicon resistor exposure process, a contact hole exposure process, a first metal layer exposure process, a via hole exposure process, and a second metal layer exposure process of the display region, respectively; and
    the second set of photomasks comprises a plurality of photomasks corresponding to an N-well exposure process, a P-well exposure process, a shallow trench isolation exposure process, a P-well $V_T$ adjust exposure process, an N-well $V_T$ adjust exposure process, a gate exposure process, an N-LDD exposure process, an N-channel source/drain exposure process, a P-channel source/drain exposure process, a salicide block exposure process, a high resistance polysilicon resistor exposure process, a contact hole exposure process, a first metal layer exposure process, a via hole exposure process, and a second metal layer exposure process of the peripheral region, respectively.

7. The forming method for a silicon-based display panel according to claim 6, wherein
    the forming method further comprises a cleaning process, a photoresist coating process, and a photoresist curing process, prior to the exposure process steps, and a development process and a photoresist stripping process posterior to the exposure process steps; and
    the cleaning process, the photoresist coating process, the photoresist curing process, the development process, and the photoresist stripping process of the display region and the peripheral region are performed respectively in a same process step.

8. The forming method for a silicon-based display panel according to claim 6, wherein
    the forming method further comprises an insulating layer forming process, an insulating layer etching process, an ion implantation process, a metal layer forming process, and a metal layer etching process; and
    the insulating layer forming process, the insulating layer etching process, the ion implantation process, the metal layer forming process, and the metal layer etching process of the display region and the peripheral region are performed respectively in a same processing step.

9. A silicon-based display panel, comprising
    a display region, and a peripheral region surrounding the display region, wherein an area of the display region is smaller than or equal to an effective exposure area of an exposure machine, and an exposure process of the display region and an exposure process of the peripheral region are performed in different process steps, and wherein the exposure process for the display region and the exposure process for the peripheral region are successively completed in adjacent sequential process steps; or the exposure process for the peripheral region and the exposure process for the display region are successively completed in adjacent sequential process steps.

10. The silicon-based display panel according to claim 9, further comprising an OLED display layer, wherein the OLED display layer is disposed in the display region.

11. A photomask assembly for an exposure process of a silicon-based display panel, the photomask assembly comprising:

a first set of photomasks, and a second set of photomasks, wherein the first set of photomasks corresponds to a display region of the silicon-based display panel and the second set of photomasks corresponds to a peripheral region of the silicon-based display panel, and wherein the first set of photomasks comprises a plurality of photomasks being a photomask for an N-well exposure process, a photomask for a P-well exposure process, a photomask for a shallow trench isolation exposure process, a photomask for a P-well $V_T$ adjust exposure process, a photomask for an N-well $V_T$ adjust exposure process, a photomask for a gate exposure process, a photomask for an N-LDD exposure process, a photomask for an N-channel source/drain exposure process, a photomask for a P-channel source/drain exposure process, a photomask for a salicide block exposure process, a photomask for a high resistance polysilicon resistor exposure process, a photomask for a contact hole exposure process, a photomask for a first metal layer exposure process, a photomask for a via hole exposure process, and a photomask for a second metal layer exposure process of the display region, respectively.

12. The photomask assembly according to claim 11, wherein an area of a pattern of the display region corresponding to the first set of photomasks is smaller than or equal to an effective exposure area of an exposure machine;

the second set of photomasks is provided with a plurality of circuit patterns, the plurality of circuit patterns is compact and spaced apart from one another; and a total area occupied by the plurality of circuit patterns is smaller than or equal to the effective exposure area of the exposure machine.

13. The photomask assembly according to claim 11, wherein the second set of photomasks comprises a plurality of photomasks being a photomask for an N-well exposure process, a photomask for a P-well exposure process, a photomask for a shallow trench isolation exposure process, a photomask for a P-well $V_T$ adjust exposure process, a photomask for an N-well $V_T$ adjust exposure process, a photomask for a gate exposure process, a photomask for an N-LDD exposure process, a photomask for an N-channel source/drain exposure process, a photomask for a P-channel source/drain exposure process, a photomask for a salicide block exposure process, a photomask for a high resistance polysilicon resistor exposure process, a photomask for a contact hole exposure process, a photomask for a first metal layer exposure process, a photomask for a via hole exposure process, and a photomask for a second metal layer exposure process of the peripheral region, respectively.

* * * * *